(12) United States Patent
Pan

(10) Patent No.: US 8,093,897 B2
(45) Date of Patent: Jan. 10, 2012

(54) METHOD OF DETECTING CARRIER SPIN POLARISATION AND APPARATUS FOR THE SAME

(75) Inventor: Genhua Pan, Devon (GB)

(73) Assignee: University of Plymouth, Plymouth, Devon (GB)

( * ) Notice: Subject to any disclaimer, the term of this patent is extended or adjusted under 35 U.S.C. 154(b) by 428 days.

(21) Appl. No.: 12/445,175

(22) PCT Filed: Oct. 9, 2007

(86) PCT No.: PCT/GB2007/003830
§ 371 (c)(1),
(2), (4) Date: Apr. 10, 2009

(87) PCT Pub. No.: WO2008/044001
PCT Pub. Date: Apr. 17, 2008

(65) Prior Publication Data
US 2010/0072993 A1 Mar. 25, 2010

(30) Foreign Application Priority Data

Oct. 10, 2006 (GB) .................................. 0619978.0
Oct. 10, 2006 (GB) .................................. 0619980.6

(51) Int. Cl.
*G01V 3/00* (2006.01)
(52) U.S. Cl. ........................................ 324/309; 324/307
(58) Field of Classification Search .......... 324/300–322, 324/251; 600/407–445; 257/421, 425; 438/3
See application file for complete search history.

(56) References Cited

U.S. PATENT DOCUMENTS

| | | | |
|---|---|---|---|
| 7,309,903 B2* | 12/2007 | Tanaka et al. | 257/421 |
| 7,468,282 B2* | 12/2008 | Tanaka et al. | 438/3 |
| 7,859,349 B2* | 12/2010 | Eyckmans et al. | 331/94.1 |
| 2011/0175605 A1* | 7/2011 | Kim et al. | 324/251 |

* cited by examiner

*Primary Examiner* — Brij Shrivastav
(74) *Attorney, Agent, or Firm* — Williams Mullen

(57) ABSTRACT

A method of detecting spin polarization in a subject material comprises applying a potential difference across the subject material causing an electrical current to flow across the material, thereby inducing carrier polarization within the material in a direction perpendicular to the direction of current flow, carriers of one spin orientation concentrating at a first edge of the subject material and carriers of the opposite orientation concentrating at a second edge of the material, opposite to the first edge under the action of the Spin Hall Effect (SHE); allowing spin polarized carriers to tunnel into a ferromagnetic material from the subject material in at least a portion adjacent one of the first or second edges of the subject material; and measuring the tunneling magnetoresistance (TMR) between the ferromagnetic material and the subject material at the first or second edge. An apparatus for analyzing carrier spin polarization comprises a subject material; means for applying an electric field to the subject material so as to induce a current to flow through the subject material, thereby inducing spin polarization of carriers at opposing first and second edges of the subject material in a direction perpendicular to the electric field under the action of the spin Hall effect (SHE); a ferromagnetic material in contact with at least a portion adjacent one of the first or second edges of the subject material; and means for measuring the tunneling magnetoresistance between the ferromagnetic material and the subject material at the first or second edge.

69 Claims, 5 Drawing Sheets

METHOD OF DETECTING CARRIER SPIN POLARISATION AND APPARATUS FOR THE SAME

The present invention relates to a method for the detection, measurement and transport of spin polarized carriers and to an apparatus for performing the same.

Conventional electronic devices employ the charge carrying characteristics of materials, in particular electrons in semiconductor materials. Thus, in a conventional semiconductor device, a negative charge is carried by an electron, while a positive charge is carried by an absence of electrons, or 'holes'. Recently, attention has turned to the property of electrons to exhibit specific spin orientations. In particular, an electron may be characterized as being 'spin up' (represented by the symbol '↑') or 'spin down' (represented by the symbol '↓'), depending upon the orientation of its spin. The direction of spin of an electron is detectable as a weak magnetic energy state, that is characterized by the orientation of the spin. Devices that operate according to the manipulation and control of the spin orientation of an electron have potentially wide applications in the fields of communications, computer technology and data storage. Although in the very early stages of development, the concept of using electron spins in this way has, by analogy with conventional electronics, been called 'spintronics'.

In order for a spintronic device to be developed, there is a first requirement for a method and apparatus for generating spin polarized electrons, detecting spin polarization and transport spin polarized electrons. Although spintronics is still in its relative infancy, the development of such methods and devices has received considerable attention in recent years. Indirect techniques for detecting and measuring spin polarization of electrons are known and include spectroscopic analysis to discriminate between spin-up and spin-down electrons. However, there is a need for a direct method of detecting and quantifying spin polarisation of electrons in a material or medium.

Thus, U.S. Pat. No. 6,369,404 discloses a device for the measurement of single electron and nuclear spins. The device comprises a semiconductor substrate, onto which is introduced at least one donor atom to produce a donor nuclear spin electron system having large electron wave functions at the nucleus of the donor atom. An insulating layer extends across the substrate, to which is attached first and second conducting gates. The first gate controls the energy of the bound electron state at the donor atom. The second gate is used to generate at least one additional electron in the substrate. The gates are biased to move the additional electron to the donor atom in the substrate, when the spins of the additional electron and donor electron or nucleus so permit.

U.S. Pat. No. 6,403,999 discloses a method and apparatus for the detection of free electrons with a selected spin polarization within a semiconductor material. The method involves applying a static magnetic field and an electromagnetic field to the semiconductor, during which free electrons are injected into the semiconductor by way of diffusion or tunneling techniques from a ferromagnetic material. The movement of the spin polarized electrons within the semiconductor gives rise to a Hall voltage across the semiconductor by virtue of the applied magnetic field and the Hall effect. The measurement of this Hall voltage is used to estimate a concentration of free electrons with a given spin. This method relies upon the application of magnetic fields and the resulting Hall effect voltage arising from the movement of the electrons within the semiconductor.

EP 1 659 416 concerns a method and apparatus for spin detection. The method for detecting spin polarization in a medium comprises measuring a first current on a first contact with the medium having a first spin selectivity, measuring a second current on a second contact with the medium having a second spin selectivity, and deriving an average or statistically relevant spin state from a comparison of the first and second currents. The selectivity of the first and second contacts to the spin is achieved using a combination of materials having different magnetic properties.

One technique that has received significant attention in recent years for the handling of spin polarized electrons is spin tunneling. Spin tunneling is a technique by which spin polarized carriers, in particular electrons, are caused to pass from a source material into a second material. The technique has been known for some time and observed in the case of two ferromagnetic materials. Thus, Pan, F. M., et al., 'Transport Properties on $La_{0.7}Sr_{0.3}MnO_3/Al_2O_3/Fe$ Tunnel Junctions', Journal of Zhejiang University Science, 2000, Vol. 1, No. 2, pages 121 to 124 describes experiments in which the transport of spin polarized electrons between a layer of LaSrMnO and a layer of iron was observed. The aforementioned layers were separated by an insulating layer of alumina ($Al_2O_3$).

More recently, attention has focused on similar spin tunneling phenomena for the transport of spin polarized electrons from a source material, for example a ferromagnetic material, into a semiconductor material. This technique has been recognized as having potential in realizing many devices based upon the principles of electron spin polarization and spintronics.

Motsnyi, V. F., et al., 'Electrical Spin Injection in a Ferromagnetic/Tunnel Barrier/Semiconductor Heterostructure', APL 81, 265 (2002) describe experiments conducted to investigate the electrical ballistic electron spin injection from a ferromagnetic metal/tunnel barrier contact into a semiconductor II-V heterostructure. An injected spin polarization of 8% at 80K was observed in a $CoFe/Al_2O_3/GaAs/(Al,Ga)As$ structure.

Van Dorpe, P. et al., 'Highly Efficient Room Temperature Spin Injection in a Metal-Insulator-Semiconductor Light-Emitting Diode', Jpn. J. Appl. Phys. Vol. 42, No. 5B, pages L502 to L504, describe similar experiments to demonstrate the efficiency of spin injection into an AlGaAs/GaAs semiconductor from a $CoFe/AlO_x$ tunnel spin injector.

Ohno, H. et al. 'Semiconductor Spin Electronics', ISAP International, No. 5 (January 2002) pages 4 to 13 provide a general report into the basic principles of spin polarization in semiconductors and techniques for its use. They describe the principles of spin injection into a ferromagnetic/semiconductor structure and indicate that injection of spin in p-n junctions using magnetic semiconductors has been confirmed by measuring the polarization of light emitted from the recombination of spin polarized electrons and unpolarised holes.

Saikin, S. et al., 'Modelling for Semiconductor Spintronics', IEE Proc.—Circuits Devices Syst., Vol. 152, No. 4, August 2005, pages 366 to 376 summarise approaches to modeling spin transport. It is stated that the problem of spin injection into a nonmagnetic semiconductor is one of the important issues of semiconductor spintronics. It is disclosed that spin-polarised electrons may be injected into a semiconductor from a metal ferromagnetic contact through a Schottky barrier.

WO 2005/109517 discloses a semiconductor device using location and the sign of the spin of electrons and having a spin valve structure. The device comprises a ferromagnetic layer on a substrate having a tunnel barrier layer. A multilayered structure is disclosed, an example being a $Ga_{0.94}Mn_{0.06}As/GaAs/Ga_{0.34}Mn_{0.06}As$ trilayer structure.

In a topical review, Schmidt G. 'Concepts for spin injection into semiconductors—a review', J. Phys. D: Appl. Phys. 38 (2005) pages R107 to R122, reviews systems for spin injection into semiconductors and methods for trying to estimate the spin injection efficiency of the system. Systems are disclosed which involve spin injection through a Schottky barrier and through an oxide tunnel barrier layer, for example $Al_2O_3$ tunnel barriers.

Perhaps most recently, Saikin S., et al., 'Spin dynamics in a compound semiconductor spintronic structure with a Schottky barrier', J. Phys.: Condens. Matter 18 (2006), pages 1535 to 1544, provide a theoretical demonstration of spin injection through a Schottky barrier into GaAs semiconductors.

It will be appreciated that methods and apparatus are known that exhibit the transport of spin polarized electrons, in particular to and from ferromagnetic materials. There is a need for an efficient and improved method and apparatus to analyze and measure electron spin polarization in subject materials, in particular semiconductor materials. It would also be advantageous if the method and apparatus could provide for the transport of spin polarized carriers, in particular electrons. Such a device would be of significant potential value in the development of spintronic devices.

A second technique that has received significant attention in recent years for use in the detection and measurement of electron spin polarization and the transport of spin polarized electrons into and out of a medium relies upon the phenomenon of Andreev Reflection (AR). AR is a phenomenon of superconductors, by which a current in a metal or semiconductor is converted to a supercurrent at the junction with a superconductor. In a metal with zero spin polarization, an electron approaching a junction with a superconductor must be a member of an electron pair (known as a 'Cooper pair'), in order to proceed and form part of the supercurrent. The second electron required to form the electron pair in the superconductor is provided by the metal, forming a hole at the interface. The hole is reflected and propagates away from the interface through the metal, as the electron pair enters the superconductor. The action of the reflected hole is that of a parallel conduction channel, which has the effect of increasing the conductance of the normal state metal by 100%. Superconducting electron pairs consist of a spin-up electron and a spin-down electron. Thus, a spin-up electron at the interface requires a spin-down electron to be removed from the metal to form the spin neutral supercurrent. This leaves a spin-up hole to propagate away from the interface through the metal. Similarly, a spin-down electron at the interface will propagate a spin-up hole. As the electrons in the metal become spin polarized at the interface, the effect is to reduce the conductance. Thus, at a spin polarization of 100%, an electron, say a spin-up electron, approaching the interface requires a spin-down electron to be removed from the metal, in order to form the superconducting pair. However, at 100% spin polarization, all electrons at the interface will be spin-up. The absence of a complementary spin-down electron prevents the propagation of the electron pair, AR is prevented, and the conductance at the interface is reduced to zero. Conductance at the conductor/superconductor interface may thus range from 0 to 200% of normal conductance, depending upon the degree of spin polarization in the conductor material.

AR has been recognized as being of use in the measurement of spin polarization within a metal.

Soulen, R. J., et al., 'Measuring the Spin Polarisation of a Metal with a Superconducting Point Contact', Science, Vol. 282, 2 Oct. 1998, pages 85 to 88, describe experiments using a pointed probe of superconducting metal (niobium or tantalum) to investigate spin polarization in a range of metals, including nickel, iron, cobalt and mixtures thereof, NiMnSb, LaSrMn oxide and chromium (IV) oxide.

Das Sarma, S. et al., 'Spintronics: electron spin coherence, entanglement and transport', Superlattices and Microstructures, Vol. 27, No. 5/6, 2000, pages 289 to 292, discuss theoretical results on aspects of spintronics, including the theory of spin transport across a semiconductor/superconductor boundary by way of AR.

Mazin, I. I., et al., 'Probing spin polarization with Andreev reflection: a theoretical basis', Journal of Applied Physics, Vol. 89, No. 11, 1 Jun. 2001, pages 7576 to 7578, propose certain theoretical formulae for analysis of AR at a superconductor-ferromagnet interface.

Panguluri, R. P., et al., 'Measurement of spin polarization by Andreev reflection in ferromagnetic $In_{1-x}Mn_xSb$ epilayers', Applied Physics Letters, Vol. 84, No. 24, 14 Jun. 2004, pages 4947 to 4949, describe experiments using Andreev reflection spin spectroscopy measurements to quantify the spin polarization in $In_{1-x}Mn_xSb$ to be about 52%.

Accordingly, in a first aspect, the present invention provides a method of detecting spin polarization in a subject material, the method comprising:

applying a potential difference across the subject material causing an electrical current to flow across the material, thereby inducing carrier polarization within the material in a direction perpendicular to the direction of current flow, carriers of one spin orientation concentrating at a first edge of the subject material and carriers of the opposite orientation concentrating at a second edge of the material, opposite to the first edge under the action of the Spin Hall Effect (SHE);

placing a ferromagnetic material in contact with the subject material to allow for the spin tunneling of carriers from the subject material into the ferromagnetic material in at least a portion adjacent one of the first or second edges of the subject material; and measuring the tunneling magnetoresistance between the ferromagnetic material and the subject material at the first or second edge.

Tunneling magnetoresistance (TMR) is a measure of the tunneling resistance of carriers flowing between a first ferromagnetic layer and a second layer of ferromagnetic material or a semiconductor. In the method of the present invention, spin polarized electrons are caused to pass from the subject material into the ferromagnetic material when the magnetic orientation of the ferromagnetic material is parallel with the spin orientation in the subject material. TMR is dependent upon the relative spin orientation in the two materials. In the present invention, measurement of the TMR when the Spin Hall Effect (SHE) is generated in the subject material will allow a determination of the extent of spin polarization in the subject material. Techniques for measuring TMR suitable for use in the method of the present invention are known in the art.

The spin Hall effect (SHE) is a phenomenon analogous to the Hall effect known and employed in conventional electronic systems. The Hall effect is the production of a potential difference across a material when a current is caused to flow through the material in the presence of an applied magnetic field. The potential difference, the Hall voltage, is established perpendicular to the applied electrical and magnetic fields. The SHE manifests itself as the concentration of electrons of a given spin at one side of a material when an electrical current is caused to flow through the material. The polarization of carriers according to their spin occurs perpendicular to the applied electric field. The SHE arises without the application of a magnetic field to the material. It should be noted that the SHE, while polarizing the carriers according to their spin, does not give rise to an electrical potential difference across the material, the spin polarized carriers being distributed in a neutral charge pattern.

SHE has been identified and observed to exist in semiconductors. Wunderlich, J., et al., 'Experimental Observation of the Spin-Hall Effect in a Two-Dimensional Spin-Orbit Coupled Semiconductor System', Physical Review Letters, 4 Feb. 2005, pages 047204-1 to 047204-4 measured the circular polarization of light emitted by LEDs to detect the presence of spin polarization. Kato, Y. K., et al., 'Observation of the Spin Hall Effect in Semiconductors', Science, Vol. 306, 10 Dec. 2004, pages 1910 to 1913 identified electrically induced electron spin polarization at the edges of a semiconductor channel using Kerr rotation spectroscopy. The SHE has also been detected optically at room temperature in n-type ZnSe epilayers using Kerr rotation spectroscopy by Stern, N. P. et al., 'Current-Induced Polarization and the Spin Hall Effect at Room Temperature', arXiv:cond-mat/0607288 v1, Jul. 11, 2006.

In the method of the present invention, an electric field is applied to the subject material, such that a current passes through the subject material, in order to induce the SHE, thus spin polarizing the carriers, such that carriers having a first spin orientation flow along a first edge of the subject material and carriers having the opposite spin orientation flow along the opposite, second edge of the subject material, the direction of spin polarization being perpendicular to the applied electric field.

In the method of the present invention, an electric field is applied across the subject material, in order to generate the SHE. The electric field to the subject material is of sufficient strength to induce the SHE. Preferably, the electric field applied is typically in the range of from up to 250 mV/μm, more preferably from 0 to 100 mV/□m.

The transport of spin polarized carriers may be carried out using spin tunneling techniques known in the art, such as those described in the prior art documents discussed hereinbefore. The spin polarized carriers may be holes or electrons, most preferably electrons.

In the art, spin injection is achieved using a ferromagnetic material as a source of spin polarized carriers. In known techniques, the tunneling of spin polarized carriers is achieved by applying a first magnetic field to the ferromagnetic material, inducing a first spin polarization in carriers in the ferromagnetic material, and a second magnetic field, to a second material to induce a second spin polarization in the carriers in the second material. When the first and second magnetic fields are aligned or parallel, the injection of spin polarized carriers may occur from the ferromagnetic source material into the second material, as the spin orientations in the two materials are the same. The spin injection efficiency reduces as the first and second magnetic fields are moved out of alignment, and hence the spin orientation changes, until the efficiency drops to zero when the first and second magnetic fields are antiparallel.

In the present invention, spin polarization of the carriers is induced as a result of the SHE and not by the application of a magnetic field. The application of a magnetic field to a ferromagnetic material orients the spin polarization of the carriers in the ferromagnetic material, according to the orientation of the applied magnetic field. This spin orientation remains once the ferromagnetic material is removed from the magnetic field and until the material is subjected to a further magnetic field to change the orientation. In the present invention, the spin polarized carriers are caused to pass into the ferromagnetic material when the spin polarization induced in the subject material by the SHE matches that present in the ferromagnetic material. The extent of spin transport achieved by way of spin tunneling into the ferromagnetic material from the subject material depends upon the extent of spin polarization induced by the SHE and the spin orientation, together with the spin orientation of carriers in the ferromagnet, established by the orientation of the magnetic field applied to the ferromagnetic material. The concentration of carriers with a given spin orientation in the subject material will differ according to the position in the subject material under the action of the SHE, as described above. Measurement of the TMR between a portion of the subject material and the ferromagnetic source material will give an indication of the degree of spin polarization in the subject material, for a given carrier spin orientation in the ferromagnetic material. The orientation of the spin polarization may be determined by altering the direction of the spin orientation in the ferromagnet by applying a further magnetic field to the ferromagnetic material, to induce a change in the spin orientation, and monitoring the change in the TMR. Accordingly, the method of the present invention may comprise changing the spin orientation of the carriers in the ferromagnetic material by the application of a further magnetic field. This change in spin orientation may be carried out one or a plurality of times, in order to allow the spin tunneling of carriers of different spin orientations from the subject material. Applying a magnetic field to the ferromagnetic material may also be used to provide a switch to control the spin tunneling of carriers from the subject material.

The method of the present invention allows spin polarization in the subject material having either horizontal or vertical spin orientations to be determined and quantified.

Suitable ferromagnetic materials for spin tunneling and spin injection are known in the art and include both crystalline and non-crystalline (amorphous) ferromagnetic materials. Examples of suitable ferromagnetic materials are the metals cobalt, iron, nickel, gadolinium and dysprosium. Crystalline ferromagnetic materials include oxides of iron, nickel/iron, copper/iron, magnesium/iron, manganese/iron, yttrium/iron, chromium and europium. Amorphous ferromagnetic materials suitable for use include transition metal-metalloid alloys, typically comprising 80% of a transition metal, for example iron, cobalt or nickel, and a metalloid, for example boron, carbon, silicon, phosphorous or aluminium. Other suitable ferromagnetic materials include combinations of manganese/bismuth, manganese/antimony, nickel/manganese/antimony and manganese/arsenic. Preferred magnetic materials include cobalt (Co), nickel (Ni), iron (Fe), together with alloys of cobalt, iron, nickel, niobium, bismuth and zirconium, in particular cobalt/iron (CoFe), nickel/iron (NiFe), cobalt/iron/niobium (CoFeNb), cobalt/zirconium (CoZr), cobalt/iron/zirconium (CoFeZr), cobalt/iron/bismuth (CoFeB), and nickel/iron/bismuth (NiFeB).

Ferromagnetism is generally exhibited by ferromagnetic materials at temperatures below the Curie temperature. Accordingly, the method of the present invention should be operated below the Curie temperature of the particular ferromagnetic material being used as the spin injection source.

Charge carriers are spin polarized in a ferromagnetic material by the action of an applied magnetic field. Once the field has been applied, the spin polarization remains an intrinsic property of the material until a second, different magnetic field is applied. The magnetic field applied must be of sufficient strength to reverse the magnetic orientation of the ferromagnetic material and suitable field strengths will be known to the person skilled in the art. Preferred magnetic field strengths for applying to the ferromagnetic material range from 50 Nm to 20,000 Nm.

The subject material may be one that exhibits SHE as an intrinsic property. Alternatively, the SHE may be induced in the subject material by the incorporation of impurities into the material, so-called extrinsic SHE. For example, a n-doped or p-doped semiconductor will exhibit SHE as a result of the dopant.

The subject material may be a Paramagnetic material or a semiconductor. In a preferred embodiment, the subject material is a semiconductor material. The semiconductor may be an elementary semiconductor in group III or IV of the period table, or a compound semiconductor of groups III-V and groups II-VI, or oxide semiconductors. The semiconductor may be an intrinsic semiconductor, or may be an extrinsic semiconductor, with one or more dopants. The semiconductor subject material may comprise an n-type or a p-type semiconductor. Suitable semiconductor materials are known in the art and include bulk or thin film semiconductors such as gallium arsenides (GaAs), gallium antimonys (GaSb), indium arsenides (InAs), indium antimonys (InSb), aluminium aresenides (AlAs), aluminium antimonys (AlSb), indium phosphides (InP), zinc selenide (ZnSe), silicon, germanium, aluminium gallium arsenides (AlGaAs), and indium gallium arsenides (InGaAs).

Particularly preferred semiconductors include zinc selenide, gallium arsenides and aluminium gallium arsenides. One preferred aluminium gallium arsenide is $Al_{0.4}Ga_{0.6}As$.

The subject material may comprise a single layer of material. Alternatively, the subject material comprises a plurality of layers, in particular a plurality of layers of different semiconductor materials, with subject materials comprising two layers of semiconductor material being preferred. Thus, in one embodiment, the subject material in which the SHE is induced comprises a first layer of aluminium gallium arsenide, in particular $Al_{0.4}Ga_{0.6}As$, and a second layer of gallium arsenide, in particular i-gallium arsenide.

The layers may be of any suitable thickness. It is preferred that the first layer in contact with the superconductor material has a thickness of from 1 to 10 μm, more preferably from 1 to 5 μm, especially approximately 2 μm.

The spin transport from the subject material may be effected directly through a suitable junction between the ferromagnetic material and the subject material to allow the transport of spin polarized carriers by spin tunneling. Preferably, the spin injection from the ferromagnetic material is conducted through a tunneling barrier layer disposed between the ferromagnetic layer and the subject material. This arrangement offers the advantage that the interface between ferromagnetic material and the subject material will be more stable over time, be less sensitive to temperature fluctuations that direct metal/semiconductor contacts, and will allow the magnetic properties to be more closely controlled. Suitable tunneling barrier materials are known in the art and include metal oxides. Examples of suitable tunneling barrier materials include magnesium oxide, aluminium oxide and hafnium oxide.

The measurement of the TMR may be effected by any suitable means known in the art. In a preferred embodiment, the measurements are made using a 4-point probe. A 4-point probe may be employed to measure one or several parameters, including potential difference, electrical current, and temperature. Suitable probes for carrying out the measurements of the method are known in the art and are available commercially. In a preferred embodiment, the TMR measurements are conducted using a 4-point probe in combination with a constant electrical current source/meter.

TMR may be calculated using I/V determinations, or more particularly dI/dV measurements.

As noted above, recent investigations into the SHE have relied upon indirect methods to identify and establish the effect and its properties, in particular optical techniques. It is an advantage of the method of the present invention that it may be used to directly analyse the SHE exhibited by a subject material. Accordingly, in a further aspect, the present invention provides a method for measuring the spin hall effect (SHE) in a subject material, the method comprising:

applying a potential difference across the subject material causing an electrical current to flow across the material, thereby inducing carrier polarization within the material in a direction perpendicular to the direction of current flow, carriers of one spin orientation concentrating at a first edge of the subject material and carriers of the opposite orientation concentrating at a second edge of the material, opposite to the first edge under the action of the Spin Hall Effect (SHE);

placing a ferromagnetic material in contact with the subject material to allow for the spin tunneling of carriers from the subject material into the ferromagnetic material in at least a portion adjacent one of the first or second edges of the subject material; and measuring the tunneling magnetoresistance between the ferromagnetic material and the subject material at the first or second edge.

As noted above, the method may be used to detect the presence of the SHE in a subject material. The magnitude of the spin hall polarization may be determined from the TMR values measured. In addition, as discussed hereinbefore, by applying magnetic fields of different orientation to the ferromagnetic source layer, to vary the orientation of the spin polarization in the ferromagnetic material, the orientation of the polarization induced in a portion of the subject material by the SHE may be determined and quantified.

In addition to providing a mechanism for measuring spin polarization in carriers and the presence and magnitude of the SHE in a subject material, the method of the present invention may also be used to produce spin polarized carriers, in particular electrons. Accordingly, in a further aspect, the present invention provides a method for the production of spin polarized carriers from a subject material, the method comprising:

applying a potential difference across the subject material causing an electrical current to flow across the material, thereby inducing carrier polarization within the material in a direction perpendicular to the direction of current flow, carriers of one spin orientation concentrating at a first edge of the subject material and carriers of the opposite orientation concentrating at a second edge of the material, opposite to the first edge under the action of the Spin Hall Effect (SHE); and placing a ferromagnetic material in contact with the subject material in to allow for the spin tunneling of carriers from the subject material into the ferromagnetic material at least a portion adjacent one of the first or second edges of the subject material;

wherein the spin orientation of the carriers in the ferromagnetic material is such to cause the transport of spin polarized carriers from the subject material into the ferromagnetic material.

In the method of this aspect of the invention, the SHE is used to produce a spin polarization of the desired orientation in carriers in a portion of the subject material. The ferromagnetic source layer is such that the spin orientation of carriers in the ferromagnetic material is the same as that of the carriers in the portion of the subject material. In this way, spin polarized carriers are transported from the subject material into the ferromagnetic material.

The flow of spin polarized carriers from the subject material may be controlled by applying a magnetic field to the ferromagnetic material, so as to change the spin orientation of the carriers in the ferromagnet. Once the spin orientation of the carriers in the ferromagnetic material is not aligned with that of the subject material, spin tunneling will decline and/or cease. The flow of spin polarized carriers may be started by the application of the appropriately oriented magnetic field to the ferromagnet.

In a further aspect, the present invention provides an apparatus for analyzing carrier spin polarization, the apparatus comprising:

a subject material;

means for applying an electric field to the subject material so as to induce a current to flow through the subject material, thereby inducing spin polarization of carriers at opposing first and second edges of the subject material in a direction perpendicular to the electric field under the action of the spin Hall effect (SHE);

a ferromagnetic material in contact with at least a portion adjacent one of the first or second edges of the subject material to allow for the spin tunneling of carriers from the subject material into the ferromagnetic material; and means for measuring the tunneling magnetoresistance between the ferromagnetic material and the subject material at the first or second edge.

The subject material is selected and the applied electric field such that the SHE is induced in the material and the carriers are polarized according to their spin.

As noted above, the subject material may be any suitable material that exhibits the SHE under the influence of an applied electric field. Preferably, the subject material is a semiconductor material. The semiconductor material may comprise an intrinsic semiconductor and/or an extrinsic semiconductor material. In particular, the subject material may comprise an n-type and/or a p-type semiconductor.

A particularly preferred semiconductor material is a gallium arsenide semiconductor or an aluminium gallium arsenide semiconductor. A preferred aluminum gallium arsenide is $Al_{0.4}Ga_{0.6}As$.

The subject material may comprise a single layer of material. Preferably, the subject material comprises a plurality of layers of different materials, in particular two or three layers of material. In one preferred arrangement, the subject material comprises two layers, each layer comprising a different semiconductor material.

The ferromagnetic source material may be any suitable ferromagnetic material, details of which are described hereinbefore.

As discussed above, the ferromagnetic material may contact the subject material directly to allow for the spin tunneling of carriers from the subject material into the ferromagnetic material. Preferably, the apparatus comprises a layer of tunneling barrier material disposed between the ferromagnetic material and the subject material. Suitable tunnel barrier materials include metal oxides, in particular oxides of magnesium, aluminum and hafnium.

The apparatus may comprise any suitable means for determining the TMR. Preferably, the apparatus comprises a 4-point probe, such as those commercially available in the art or a constant electrical current source/meter, more preferably a combination of both a 4-point probe and a constant current source/meter.

The apparatus may comprise means for applying a magnetic field to the ferromagnetic material, such that the spin orientation of carriers in the ferromagnetic material may be varied.

In a further aspect, the present invention provides an apparatus for measuring the spin hall effect (SHE) in a subject material, the apparatus comprising:

a subject material;

means for applying an electric field to the subject material so as to induce a current to flow through the subject material, thereby inducing spin polarization of carriers at opposing first and second edges of the subject material in a direction perpendicular to the electric field under the action of the spin Hall effect (SHE);

a ferromagnetic material in contact with at least a portion adjacent one of the first or second edges of the subject material to allow for the spin tunneling of carriers from the subject material into the ferromagnetic material; and means for measuring the tunneling magnetoresistance between the ferromagnetic material and the subject material at the first or second edge.

The apparatus may comprise means for applying a magnetic field to the ferromagnetic material, such that the spin orientation of carriers in the ferromagnetic material may be varied.

In still a further aspect, the present invention provides an apparatus for the production of spin polarized carriers in a subject material, the apparatus comprising:

a subject material;

means for applying an electric field to the subject material so as to induce a current to flow through the subject material, thereby inducing spin polarization of carriers at opposing first and second edges of the subject material in a direction perpendicular to the electric field under the action of the spin Hall effect (SHE); and a ferromagnetic material in contact with at least a portion adjacent one of the first or second edges of the subject material to allow for the spin tunneling of carriers from the subject material into the ferromagnetic material;

whereby spin polarized carriers are caused to move from the subject material into the ferromagnetic material.

The apparatus may comprise means for applying a magnetic field to the ferromagnetic material, such that the spin orientation of carriers in the ferromagnetic material may be varied.

Further, it has also been found that the phenomenon of Andreev reflection and the effect of electron spin polarization can be efficiently combined with the phenomenon of spin Hall effect (SHE) to provide a method of identifying and quantifying electrons polarized according to their spin.

Accordingly, in a further aspect, the present invention provides a method of detecting electron spin polarization in a subject material, the method comprising:

applying a potential difference across the subject material causing an electrical current to flow across the material, thereby inducing electron polarization within the material in a direction perpendicular to the direction of current flow, electrons of one spin orientation concentrating at a first edge of the subject material and electrons of the opposite orientation concentrating at a second edge of the material, opposite to the first edge under the action of the Spin Hall Effect (SHE);

connecting a conductor material to one of the first or second edges, under conditions such that the conductor material is a superconductor;

determining the conductance of the conductor material at the junction with the subject material to obtain a first value of conductance; and comparing the first value of conductance with a second value of conductance of the conductor material determined at the junction of the conductor material with the subject material when no potential difference is applied.

The subject material may be one that exhibits SHE as an intrinsic property. Alternatively, the SHE may be induced in the subject material by the incorporation of impurities into the material, so-called extrinsic SHE. For example, a n-doped or p-doped semiconductor will exhibit SHE as a result of the dopant.

The subject material may be a paramagnetic metal or a semiconductor. Suitable paramagnetic metals are known in the art and include platinum, palladium, rhenium, or metals which may exhibit paramagnetism such as aluminium, copper, gold and silver.

In a preferred embodiment, the subject material is a semiconductor material. The semiconductor may be an elementary semiconductor in group III or IV of the period table, or a compound semiconductor of Groups III-V and Groups The semiconductor may be an intrinsic semiconductor, or may be an extrinsic semiconductor, with one or more dopants. The semiconductor subject material may comprise an n-type or a p-type semiconductor. Suitable semiconductor materials are known in the art and include bulk or thin film semiconductors such as gallium arsenides (GaAs), gallium antimonys (GaSb), indium arsenides (InAs), indium antimonys (InSb), aluminium aresenides (AlAs), aluminium antimonys (AlSb), indium phosphides (InP), Zinc Selenide (ZnSe), silicon, germanium, aluminium gallium arsenides (AlGaAs), and indium gallium arsenides (InGaAs).

Particularly preferred semiconductors include zinc selenide, gallium arsenides and aluminium gallium arsenides. One preferred aluminium gallium arsenide is $Al_{0.4}Ga_{0.6}As$.

The subject material may comprise a single layer of material. Alternatively, the subject material comprises a plurality of layers, in particular a plurality of layers of different semiconductor materials, with subject materials comprising two or three layers of semiconductor material being preferred. Thus, in one embodiment, the subject material in which the SHE is induced comprises a first layer of a gallium arsenide, in particular n-gallium arsenide, a second layer of an aluminium gallium arsenide, in particular $Al_{0.4}Ga_{0.6}As$, and a third layer of a gallium arsenide, in particular i-gallium arsenide.

The layers may be of any suitable thickness. It is preferred that the first layer in contact with the superconductor material has a thickness of from 1 to 10 µm, more preferably from 1 to 5 µm, especially approximately 2 µm. The second layer may be of a similar thickness to the first layer. The third layer may be thicker and act as a support layer.

The subject material may be in any form to provide a two-dimensional electron system (2DES), in which the SHE is exhibited. For example, subject material may be in the form of a layer of a single material, for example an aluminium gallium arsenide. Preferably, the subject material comprises two layers of two different materials, which again are capable of exhibiting a detectable spin accumulation generated by the SHE. Examples of such suitable structures are disclosed by Kato, Y. K., et al., 'Observations of the Spin Hall Effect in Semiconductors', Science, Vol. 206 (2004), pages 1910 to 1913.

In a preferred arrangement, the subject material comprises a plurality of layers of semiconductor materials and the conductor is in contact with a n-type semiconductor, in particular n-gallium arsenide.

In the method of the present invention, an electric field is applied to the subject material, such that a current passes through the subject material, in order to induce the SHE, thus spin polarizing the electrons, such that spin-up electrons flow along a first edge of the subject material and spin-down electrons flow along the opposite, second edge of the subject material, the direction of spin polarization being perpendicular to the applied electric field. A conductor is connected to one of the first or second edges. The method is operated under conditions such that the conductor is superconducting.

The conductor may be a Type 1 superconductor or a Type 2 superconductor, both of which are known in the art. Type 1 superconductors, referred to as 'soft' superconductors, exhibit a very sharp transition to a superconducting state at the critical transition temperature ($T_c$), and by having a very low $T_c$. Suitable Type 1 superconductors include those elements that are superconductive at ambient pressures, that is beryllium, aluminium, titanium, yttrium, chromium, zinc, gallium, zirconium, molybdenum, ruthenium, rhodium, palladium, cadmium, indium, tin, lanthanum, hafnium, tantalum, tungsten, rhenium, osmium, iridium, platinum, mercury, thallium, lead, thorium, protactinium, uranium and americium. Details of the Type 1 superconductors may be found in The CRC Handbook of Chemistry and Physics, 87th Edition.

Type 2 superconductors, referred to as 'hard' superconductors, exhibit a gradual transition to superconduction and generally have a higher $T_c$ than Type 1 superconductors. Type 2 superconductors include the elements vanadium, technetium and niobium, together with a wide range of metallic compounds and alloys. Details of suitable Type 2 superconductors may be found in The CRC Handbook of Chemistry and Physics, 87th Edition.

Type 2 superconductors are preferred, due to their higher $T_c$ values, leading to easier operating conditions for the method of the present invention. Conductors comprising niobium, vanadium and technetium are particularly preferred.

In a preferred embodiment, the contact between the conductor and the subject material is sized to be within the ballistic transport limit, in order to conserve the spin properties of the electrons through the interface between the subject material and the superconductor. In this respect, two mechanisms in electron transport through interfaces have been identified: diffusive and ballistic. It is believed in the art that ballistic transport of electrons occurs if the contact size of the interface is smaller than the spin diffusion length of conduction electrons. Typically, spin diffusion lengths of semiconductors and superconductors is of the order of 1 µm, while the spin diffusion length of magnetic materials is of the order of 4 to 5 nm.

In the method of the present invention, an electric field is applied across the subject material, in order to generate the SHE. The applied electric field is typically in the range of from up to 250 mV/µm, more preferably from 0 to 100 mV/µm.

The method of the present invention obtains a measurement of the conductance of the conductor at one edge of the subject material when the SHE is induced in the material. This value of conductance is compared with a reference value obtained from the same edge of the subject material without the SHE being exhibited. From this comparison, the degree of spin polarization of the electrons in the subject may be directly determined, using the theories outlined above. In particular, an enhanced conduction indicates a very low degree of spin polarization, while a suppressed conduction arises from a high degree of spin polarization in the subject material. The enhancement or suppression in the conduction may be quantified to provide an indication of the degree of spin polarization.

The measurement of the conductance may be effected by any suitable means known in the art. In a preferred embodiment, the measurements are made using a 4-point probe. A 4-point probe may be employed to measure one or several parameters, including potential difference, electrical current, and temperature. Suitable probes for carrying out the measurements of the method are known in the art and are available commercially. In a preferred embodiment, the conductance measurements are conducted using a 4-point probe in combination with a constant electrical current source/meter.

Conductance may calculated using I/V determinations, or more particularly dI/dV measurements.

As noted above, recent investigations into the SHE have relied upon indirect methods to identify and establish the effect and its properties, in particular optical techniques. It is an advantage of the method of the present invention that it may be used to directly analyse the SHE exhibited by a subject material. Accordingly, in a further aspect, the present invention provides a method for measuring the spin hall effect (SHE) in a subject material, the method comprising:

applying a potential difference across the subject material causing an electrical current to flow across the material;

connecting a conductor material to one of a first or second edge of the subject material, under conditions such that the conductor material is a superconductor;

determining the conductance of the conductor material at the junction with the subject material to obtain a first value of conductance; and comparing the first value of conductance with a second value of conductance of the conductor material determined at the junction of the conductor material with the subject material when no potential difference is applied.

In a further aspect, the present invention provides an apparatus for analyzing electron spin polarization, the apparatus comprising:

a subject material;

means for applying an electric field to the subject material so as to induce a current to flow through the subject material, thereby inducing spin polarization of electrons at opposing first and second edges of the subject material in a direction perpendicular to the electric field under the action of the spin Hall effect (SHE);

a conductor in contact with one of the first or second edges of the subject material, the conductor exhibiting superconductor properties upon application of the appropriate conditions; and means for measuring the conductance of the conductor under superconducting conditions.

The subject material is selected and the applied electric field such that the SHE is induced in the material and the electrons are polarized according to their spin.

As noted above, the subject material may be any suitable material that exhibits the SHE under the influence of an applied electric field. Preferably, the subject material is a semiconductor material. The semiconductor material may comprise an intrinsic semiconductor and/or an extrinsic semiconductor material. In particular, the subject material may comprise an n-type and/or a p-type semiconductor.

A particularly preferred semiconductor material is a gallium arsenide semiconductor or an aluminium gallium arsenide semiconductor. A preferred aluminum gallium arsenide is $Al_{0.4}Ga_{0.6}As$.

The subject material may comprise a single layer of material. Preferably, the subject material comprises a plurality of layers of different materials, in particular two or three layers of material. In one preferred arrangement, the subject material comprises three layers, each layer comprising a different semiconductor material. In such an arrangement, the conductor is preferably in contact with a layer of a n-type semiconductor.

As noted, the apparatus operates under conditions whereby the conductor behaves as a superconductor. The conductor may be a Type 1 superconductor or a Type 2 superconductor. Suitable Type 1 and Type 2 conductors are known in the art, as hereinbefore described. A preferred conductor material comprises niobium, vanadium and/or technetium.

The apparatus may comprise any suitable means for determining the conductance. Preferably, the apparatus comprises a 4-point probe, such as those commercially available in the art or a constant electrical current source/meter, more preferably a combination of both a 4-point probe and a constant current source/meter.

Embodiments of the present invention will now be described, by way of example only, having reference to the accompanying figures, in which.

Figure 1:
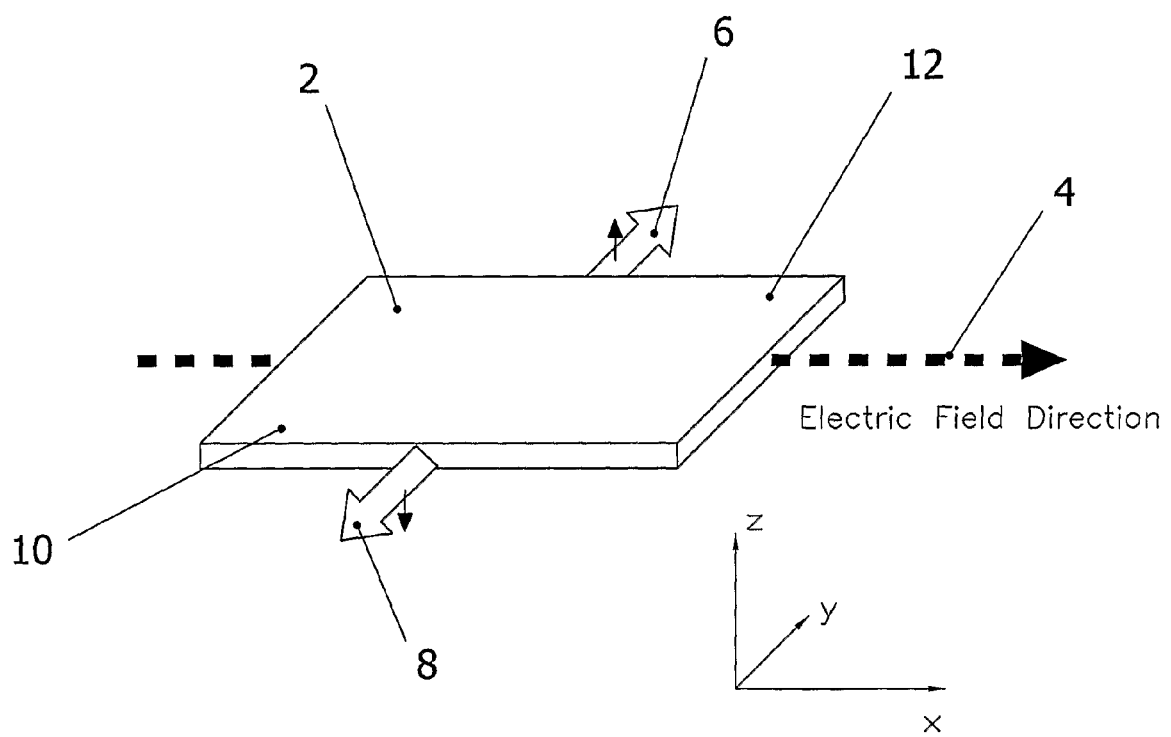
FIG. 1 is a schematic representation of the spin Hall effect in a semiconductor.

Referring to FIG. 1, there is shown a representation of the spin Hall effect (SHE) as occurring in a semiconductor material. A strip 2 of semiconductor material has an electric field applied, indicated by the arrow 4, along the longitudinal axis of the strip 2. The spin polarization induced in the carriers flowing through the semiconductor material is represented by arrows 6 and 8, extending perpendicular to the applied electric field across the strip 2. The polarization causes spin-down electrons to flow along the edge 10 of the strip 2, while spin-up electrons flow along the opposite edge 12. The SHE does induce a polarization of charge within the materials. Accordingly, the spin polarization does not give rise to a potential difference between the edges 10 and 12 of the strip 2. The method and apparatus of the present invention allow the polarization of electrons at the edges 10 and 12 to be detected and quantified.

Figure 2:
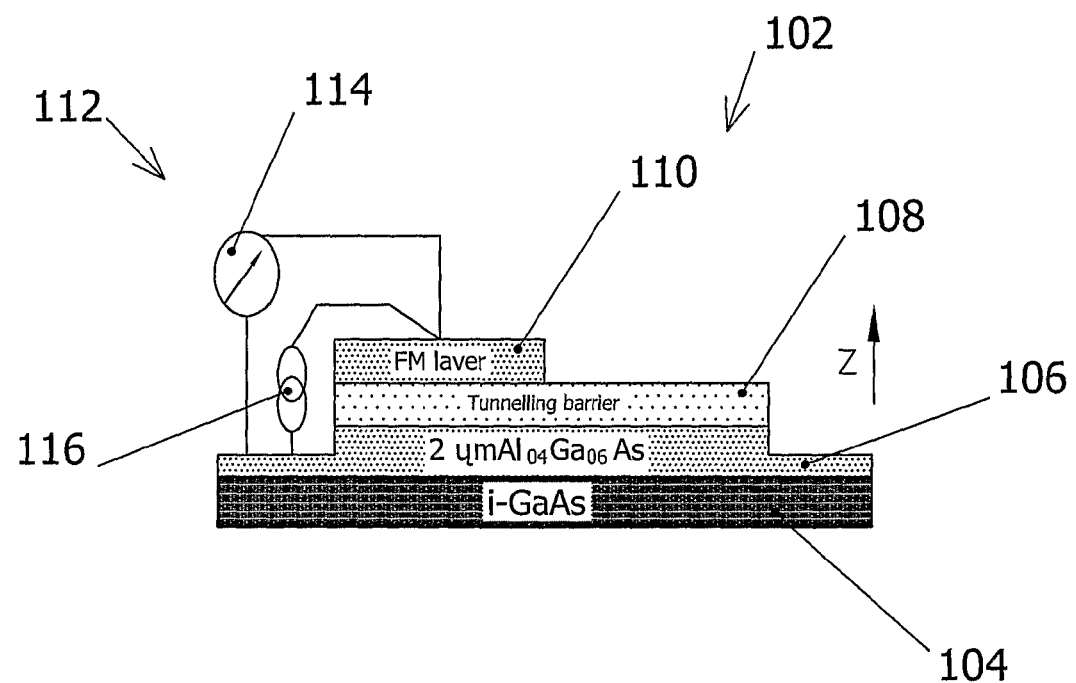
FIG. 2 is a cross-sectional representation of an apparatus according to one embodiment of the present invention.

Turning to FIG. 2, there is shown an apparatus for detecting spin polarized electrons, generally indicated as 102. The apparatus 102 comprises a substrate layer 104 of i-GaAs, the upper surface of which is in intimate contact with a layer 106 of the subject material $Al_{0.4}Ga_{0.6}As$ having a thickness of 2 μm. A layer 108 of tunneling barrier material is deposited on the upper surface of the layer 106 of subject material. A layer 110 of ferromagnetic material is deposited on one edge portion of the layer 108 of tunneling barrier material. The layer 108 of tunneling barrier material is preferably magnesium oxide or aluminium oxide, having a thickness of from 0.5 to 5 nm.

A device 112 for measuring the TMR between the layer 110 of ferromagnetic material and the layer 106 of subject material is provided and shown schematically in FIG. 2. The measurement device 112 comprises a 4-point probe 114, extending between the layer 110 of ferromagnetic material and the layer 106, and a constant current source/meter 116, similarly connected. The measurement device 112 allows measurement of the current I and potential difference V between the ferromagnetic material and the $Al_{0.4}Ga_{0.6}As$, from which the TMR is determined using I/V or dI/dV.

In operation, a magnetic field M is applied to the ferromagnetic layer and the TMR between the ferromagnetic material and the subject material is determined. An electric field E is applied to the layer 106 of subject material, inducing a flow of electrons through the subject material and spin polarization of the electrons. A second value of the TMR is determined. A comparison of the first and second TMR values will provide an indication of the SHE exhibited in the layer 106 of subject material, and hence the degree of electron spin polarization.

Adjusting the direction of the magnetic field M will allow the orientation of the spin polarized electrons in the edge portion of the subject material underlying the layer 110 of ferromagnetic material to be determined. Moving the position of the layer of ferromagnetic material will allow the spin orientation of the electrons in different portions of the subject material to be determined, thus allowing the SHE to be mapped.

Further, the apparatus shown in FIG. 2 may be operated to induce spin tunneling of electrons through the tunneling barrier from the underlying edge portion of the subject material to the ferromagnetic material, from where the spin polarized electrons may be removed. In this way, the apparatus 102 may be used to produce a current of spin polarized electrons, which current may be employed in other spintronic devices and processes relying upon the spin orientation of electrons.

The spin polarization is generated by the spin Hall effect. Maybe there is a misunderstanding of this concept in this patent. The tunneling mechanism is used to pump the polarized spins out of the semiconductor, or to detect/measure the polarized spins in the semiconductor. Please revise the patent accordingly.

The transport of spin polarized carriers is further explained by reference to FIG. 3, in which, there is shown an apparatus for producing spin polarized electrons, generally indicated as 202. The apparatus 202 comprises a layer 204 of semiconductor material, such as that shown in FIG. 2 and described hereinbefore. A layer 206 of tunneling barrier material is deposited on the upper surface of the layer 204 of semiconductor material at one edge portion 208 of the semiconductor material. The layer 206 of tunneling barrier material is preferably magnesium oxide or aluminium oxide, having a thickness of from 0.5 to 5 nm. A layer 210 of ferromagnetic material is deposited on the layer 206 of tunneling barrier material. An electrical connection 212 is represented to show the completed circuit between the semiconductor material and the ferromagnetic material.

A corresponding assembly is present on the opposite edge portion 214 of the semiconductor material 208, with identical components indicated using the same reference numerals and the suffix 'a'.

An electric field is applied to the layer 204 of semiconductor material, inducing spin polarization of electrons in the material by way of the SHE. The spin polarization of the electrons in the first edge portion 208 is up, indicated by the symbol ↑ in FIG. 3. Similarly, electrons in the second edge portion 214 have the opposite, down orientation, indicated by the symbol ↓ in FIG. 3.

The layers 210 and 210a of ferromagnetic material have an intrinsic spin polarization of the carriers, the orientation of which is shown by the up arrow symbol to indicate that the orientation of the magnetic field in the ferromagnetic material corresponds to the ↑ spin polarized electrons in the semiconductor. The orientation of the spin polarization is induced by the application of a magnetic field to the ferromagnetic material and may be varied by applying a differently oriented magnetic field.

Under these conditions of spin polarization, transport of ↑ spin polarized electrons from the first edge portion 208 of the semiconductor through the tunneling barrier material 206 into the ferromagnetic material 210 will occur. ↑ spin polarized electrons may thus be produced and provided to the circuit 212 for use in external spintronics devices. As the spin orientation of the ferromagnetic material is not aligned with the spin orientation of the electrons in the second edge portion 214 of the semiconductor 204, the production of ↓ spin polarized electrons into the ferromagnetic material 210a and the circuit 212a will not occur. Reversal of the spin orientation of the carriers in the ferromagnetic material, by a suitable applied magnetic field, will halt the transport of ↑ spin polarized electrons from the first edge portion 208 of the semiconductor 204 and allow production of ↓ spin polarized electrons from the second edge portion 214. In this way, manipulation of the applied magnetic field may be used to control the spin orientation of electrons produced from the semiconductor material.

Figure 4:
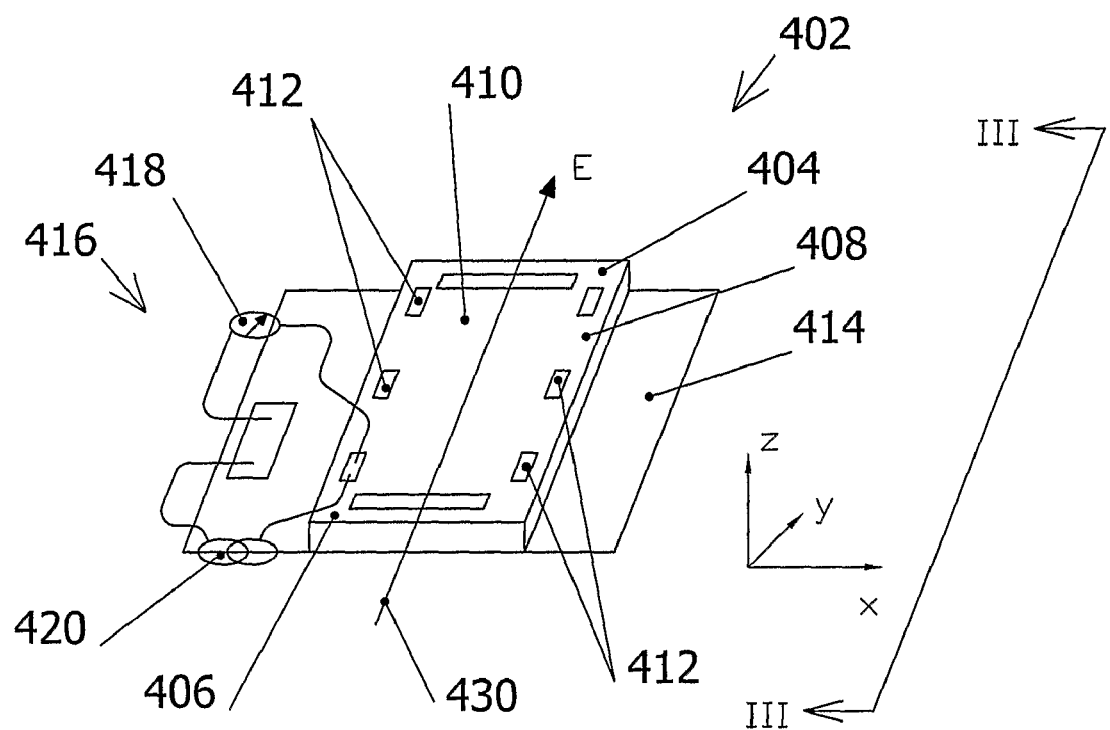
FIG. 4 is a perspective representation of an apparatus according to a third embodiment of the present invention.
Figure 5:
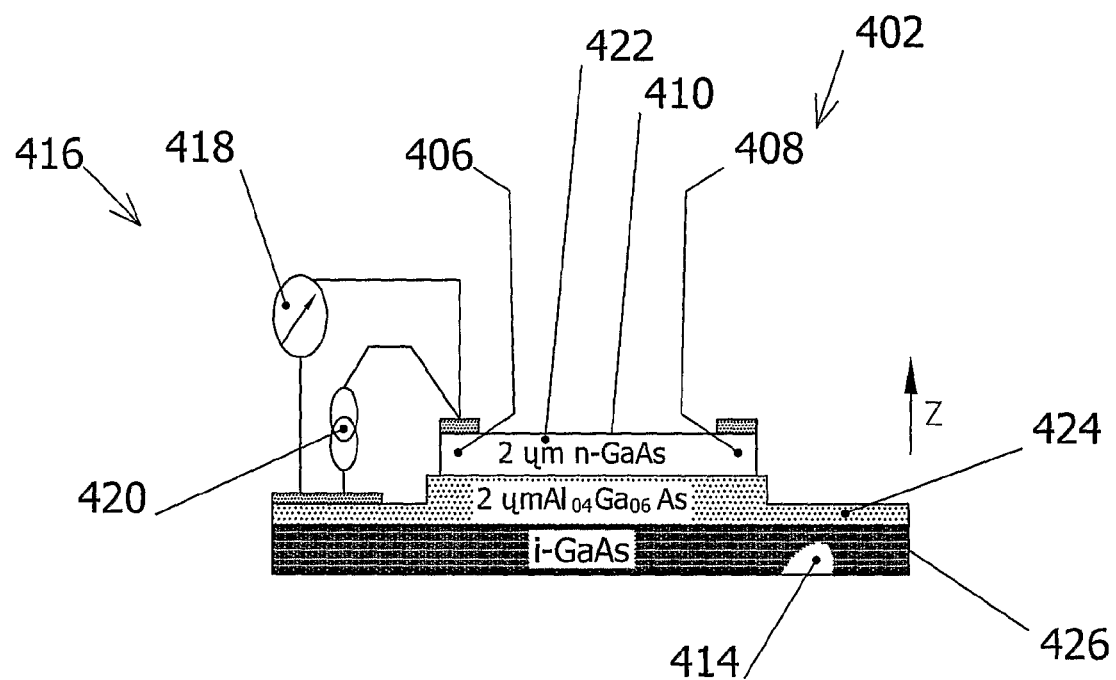
FIG. 5 is a cross-sectional representation of the apparatus of FIG. 4 along the line III-III.

Turning to FIG. 4, there is shown an apparatus for detecting spin polarized electrons, generally indicated as 402. The apparatus comprises a strip 404 of subject material having edge portions 406 and 408. The upper surface 410 of the subject material is provided with a plurality of conductor contacts 412, distributed along each of the edges 406 and 408. Each conductor contact comprises a material that is superconducting under the appropriate applied conditions, typically reduced temperature and in some cases, increased pressure. The apparatus as shown in FIG. 4 further comprises a base layer 414.

A device 416 for measuring the conductance of the conductor contact at the interface with the subject material is provided and shown schematically in FIG. 4. The measurement device 416 comprises a 4-point probe 418, extending between the contact 412 and the base layer 414, and a constant current source/meter 420, similarly connected. The measurement device 416 allows measurement of the current I and potential difference V between the contact 412 and the base layer 414, from which the conductance at the interface is determined using I/V or dI/dV.

Figure 3:
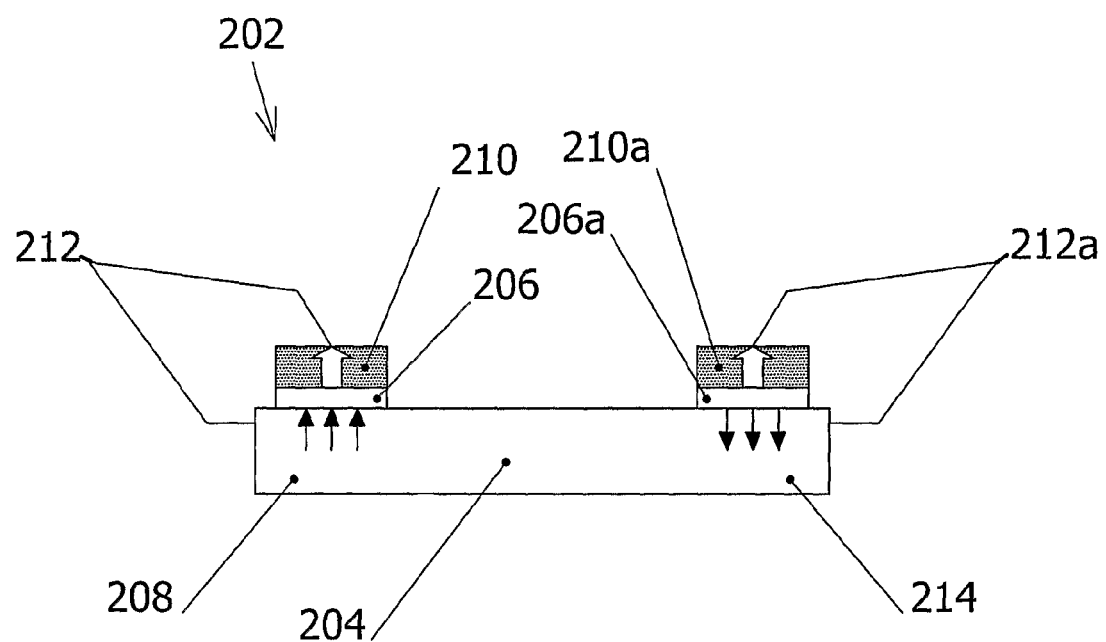
FIG. 3 is a cross-sectional representation of an apparatus according to a second embodiment of the present invention for the production of spin polarized carriers.

The construction of the apparatus 402 is shown in more detail in FIG. 3. The subject material is shown comprising three layers of semiconductor material. The upper layer 422 is a layer of n-GaAs of 2 μm thickness. The base layer 414 comprises an intermediate layer 124 of $Al_{0.4}Ga_{0.6}As$ of 2 μm thickness immediately adjacent and in contact with the upper layer 422. A support layer 426 of i-GaAs is provided. The conductor contacts 412 are formed of niobium, a Type 2 superconductor, having a $T_c$ of 9.25 K at atmospheric pressure.

It will be noted that the measurement device 416 for measuring the conductance of the conductor contact 412 is connected across the conductor contact 412 and the intermediate layer 424 at the edge 406.

In operation, the conductance of the conductor contact under superconducting conditions is determined. An electric field E is applied to the apparatus, represented by the arrow 430, in FIG. 4 inducing a flow of electrons through the subject material 404. A second value of the conductance of the conductor contact is determined, again under superconducting conditions.

The spin polarization of electrons across the subject material perpendicular to the applied electric field E is determined by a comparison of the first and second values of conductance. As described hereinbefore, polarization of the electrons according to their spin will suppress the conductance of the superconductor at the interface of the conductor contact and the upper layer 422. A spin polarization of 100% will suppress the conductance of the superconductor, according to the principles of Andreev Reflection known in the art and described hereinbefore.

The invention claimed is:

1. A method of detecting spin polarization in a subject material, the method comprising:
    applying a potential difference across the subject material causing an electrical current to flow across the subject material, thereby inducing carrier polarization within the subject material in a direction perpendicular to the direction of current flow, carriers of one spin orientation concentrating at a first edge of the subject material and carriers of the opposite orientation concentrating at a second edge of the subject material, opposite to the first edge under the action of the Spin Hall Effect (SHE);
    placing a ferromagnetic material in contact with the subject material to allow for the spin tunneling of carriers from the subject material into the ferromagnetic material in at least a portion adjacent one of the first or second edges of the subject material; and
    measuring the tunneling magnetoresistance (TMR) between the ferromagnetic material and the subject material at the first or second edge.

2. The method according to claim 1, wherein the subject material is a semiconductor material.

3. The method according to claim 2, wherein the semiconductor material comprises an intrinsic semiconductor.

4. The method according to claim 2, wherein the semiconductor material comprises an extrinsic semiconductor.

5. The method according to claim 4, wherein the semiconductor material is selected from the group comprising an ntype and a ptype semiconductor.

6. The method according to claim 1, wherein the subject material comprises a gallium arsenide semiconductor.

7. The method according to claim 1, wherein the subject material comprises an aluminium gallium arsenide semiconductor.

8. The method according to claim 7, wherein the alumunium gallium arsenide is $Al_{0.4}Ga_{0.6}As$.

9. The method according to claim 1, wherein the subject material comprises a plurality of layers of different materials.

10. The method according to claim 9, wherein the subject material comprises three layers, each layer comprising a different semiconductor material.

11. The method according to claim 1, wherein the electric field applied to the subject material is in the range of from 0 up to 250 mV/µm, more preferably from 0 to 100 mV/µm.

12. The method according to claim 1, wherein spin injection is achieved by spin tunneling.

13. The method according to claim 1, wherein the orientation of a magnetic field applied to the ferromagnetic material is adjusted to determine the spin orientation of spin polarized carriers in the portion of the subject material.

14. The method according to claim 1, wherein the ferromagnetic material is selected from the group comprising a crystalline material and an amorphous material.

15. The method according to claim 1, wherein the ferromagnetic material is selected from the group comprising cobalt, iron, nickel, gadolinium, dysprosium, a mixed oxide of iron, nickel/iron, copper/iron, magnesium/iron, manganese/iron, yttrium/iron, chromium oxide, europium oxide, a manganese/bismuth combination, a manganese/antimony combination, a nickel/manganese/antimony combination and a manganese/arsenic combination.

16. The method according to claim 1, wherein the spin polarized carriers are injected directly from the ferromagnetic material into the subject material.

17. The method according to claim 1, wherein the spin polarized carriers are injected into the subject material from the ferromagnetic material through a tunnel barrier layer.

18. The method according to claim 17, wherein the tunnel barrier layer comprises a metal oxide.

19. The method according to claim 18, wherein the metal oxide is an oxide selected from the group comprising magnesium, aluminium, and hafnium.

20. A method for measuring the spin hall effect (SHE) in a subject material, the method comprising:
    applying a potential difference across the subject material causing an electrical current to flow across the subject material, thereby inducing carrier polarization within the subject material in a direction perpendicular to the direction of current flow, carriers of one spin orientation concentrating at a first edge of the subject material and carriers of the opposite orientation concentrating at a second edge of the subject material, opposite to the first edge under the action of the Spin Hall Effect (SHE);
    placing a ferromagnetic material in contact with the subject material to allow for the spin tunneling of carriers from the subject material into the ferromagnetic material in at least a portion adjacent one of the first or second edges of the subject material; and
    measuring the tunneling magnetoresistance (TMR) between the ferromagnetic material and the subject material at the first or second edge.

21. The method of claim 20, further comprising varying the orientation of a magnetic field applied to the ferromagnetic material to determine the orientation of the spin polarization in the portion of the subject material.

22. A method for the production of spin polarized carriers from a subject material, the method comprising:
    applying a potential difference across the subject material causing an electrical current to flow across the subject material, thereby inducing carrier polarization within the subject material in a direction perpendicular to the direction of current flow, carriers of one spin orientation concentrating at a first edge of the subject material and carriers of the opposite orientation concentrating at a second edge of the subject material, opposite to the first edge under the action of the Spin Hall Effect (SHE); and
    placing a ferromagnetic material in contact with the subject material to allow for the spin tunneling of carriers from the subject material into the ferromagnetic material in at least a portion adjacent one of the first or second edges of the subject material; wherein the spin orientation of the carriers in the ferromagnetic material is such to cause the transport of spin polarized carriers from the subject material into the ferromagnetic material.

23. An apparatus for analyzing carrier spin polarization, the apparatus comprising:
    a subject material;
    means for applying an electric field to the subject material so as to induce a current to flow through the subject material, thereby inducing spin polarization of carriers at opposing first and second edges of the subject material in a direction perpendicular to the electric field under the action of the spin Hall effect (SHE);
    a ferromagnetic material in contact with at least a portion adjacent one of the first or second edges of the subject material to allow for the spin tunneling of carriers from the subject material into the ferromagnetic material; and means for measuring the tunneling magnetoresistance (TMR) between the ferromagnetic material and the subject material at the first or second edge.

24. The apparatus according to claim 23, wherein the subject material is a semiconductor material.

25. The apparatus according to claim 24, wherein the semiconductor material comprises an intrinsic semiconductor.

26. The apparatus according to claim 24, wherein the semiconductor material comprises an extrinsic semiconductor.

27. The apparatus according to claim 26, wherein the semiconductor material is selected from the group comprising an ntype and a ptype semiconductor.

28. The apparatus according to claim 23, wherein the subject material comprises a gallium arsenide semiconductor.

29. The apparatus according to claim 23, wherein the subject material comprises an aluminium gallium arsenide semiconductor.

30. The apparatus according to claim 29, wherein the alumunium gallium arsenide is $Al_{0.4}Ga_{0.6}As$.

31. The apparatus according to claim 23, wherein the subject material comprises a plurality of layers of different materials.

32. The apparatus according to claim 31, wherein the subject material comprises three layers, each layer comprising a different semiconductor material.

33. The apparatus according to claim 23, wherein the ferromagnetic material is a crystalline material or an amorphous material.

34. The apparatus according to claim 23, wherein the ferromagnetic material is selected from the group comprising cobalt, iron, nickel, gadolinium, dysprosium, a mixed oxide of iron, nickel/iron, copper/iron, magnesium/iron, manganese/iron, yttrium/iron, chromium oxide, europium oxide, a manganese/bismuth combination, a manganese/antimony combination, a nickel/manganese/antimony combination and a manganese/arsenic combination.

35. The apparatus according to claim 23, wherein the ferromagnetic material is in contact with the subject material.

36. The apparatus according to claim 23, wherein a tunnel barrier layer is disposed between the ferromagnetic material and the subject material.

37. The method according to claim 36, wherein the tunnel barrier layer comprises a metal oxide.

38. The method according to claim 37, wherein the metal oxide is an oxide selected from the group comprising of magnesium, aluminium, OF and hafnium.

39. The apparatus according to claim 23, wherein the means for measuring the tunneling magnetoresistance (TMR) is selected from the group comprising a 4-point probe, a constant current source/meter, or a combination thereof.

40. An apparatus for measuring the spin hall effect (SHE) in a subject material, the apparatus comprising:

a subject material;

means for applying an electric field to the subject material so as to induce a current to flow through the subject material, thereby inducing spin polarization of carriers at opposing first and second edges of the subject material in a direction perpendicular to the electric field under the action of the spin Hall effect (SHE);

a ferromagnetic material in contact with at least a portion adjacent one of the first or second edges of the subject material to allow for the spin tunneling of carriers from the subject material into the ferromagnetic material; and means for measuring the tunneling magnetoresistance (TMR) between the ferromagnetic material and the subject material at the first or second edge.

41. An apparatus for the production of spin polarized carriers in a subject material, the apparatus comprising:

a subject material;

means for applying an electric field to the subject material so as to induce a current to flow through the subject material, thereby inducing spin polarization of carriers at opposing first and second edges of the subject material in a direction perpendicular to the electric field under the action of the spin Hall effect (SHE); and a ferromagnetic material in contact with at least a portion adjacent one of the first or second edges of the subject material to allow for the spin tunneling of carriers from the subject material into the ferromagnetic material;

whereby spin polarized carriers are caused to move from the subject material into the ferromagnetic material.

42. A method of detecting electron spin polarization in a subject material, the method comprising:

applying a potential difference across the subject material causing an electrical current to flow across the subject material, thereby inducing electron polarization within the subject material in a direction perpendicular to the direction of current flow, electrons of one spin orientation concentrating at a first edge of the subject material and electrons of the opposite orientation concentrating at a second edge of the subject material, opposite to the first edge under the action of the Spin Hall Effect (SHE);

connecting a conductor material to one of the first or second edges, under conditions such that the conductor material is a superconductor; determining the conductance of the conductor material at the junction with the subject material to obtain a first value of conductance; and comparing the first value of conductance with a second value of conductance of the conductor material determined at the junction of the conductor material with the subject material when no potential difference is applied.

43. The method according to claim 42, wherein the subject material is a semiconductor material.

44. The method according to claim 43, wherein the semiconductor material comprises an intrinsic semiconductor.

45. The method according to claim 43, wherein the semiconductor material comprises an extrinsic semiconductor.

46. The method according to claim 45, wherein the semiconductor material is selected from the group comprising an ntype and a ptype semiconductor.

47. The method according to claim 42, wherein the subject material is selected from the group comprising a zinc selenide semiconductor, a gallium arsenide semiconductor and an aluminium gallium arsenide semiconductor.

48. The method according to claim 47, wherein the alumunium gallium arsenide is $Al_{0.4}Ga_{0.6}As$.

49. The method according to claim 42, wherein the subject material comprises a plurality of layers of different materials.

50. The method according to claim 49, wherein the subject material comprises three layers, each layer comprising a different semiconductor material.

51. The method according to claim 49, wherein the conductor material is in contact with a layer of an ntype semiconductor.

52. The method according to claim 42, wherein the conductor material is a Type 1 superconductor.

53. The method according to claim 42, wherein the conductor material is a Type 2 superconductor.

54. The method according to claim 53, wherein the conductor material is selected from the group comprising niobium, vanadium and technetium.

55. A method for measuring the spin hall effect (SHE) in a subject material, the method comprising:
applying a potential difference across the subject material causing an electrical current to flow across the subject material;
connecting a conductor material to one of a first or second edge of the subject material, under conditions such that the conductor material is a superconductor;
determining the conductance of the conductor material at the junction with the subject material to obtain a first value of conductance; and
comparing the first value of conductance with a second value of conductance of the conductor material determined at the junction of the conductor material with the subject material when no potential difference is applied.

56. An apparatus for analyzing electron spin polarization, the apparatus comprising:
a subject material;
means for applying an electric field to the subject material so as to induce a current to flow through the subject material, thereby inducing spin polarization of electrons at opposing first and second edges of the subject material in a direction perpendicular to the electric field under the action of the spin Hall effect (SHE);
a conductor material in contact with one of the first or second edges of the subject material, the conductor material exhibiting superconductor properties upon application of the appropriate conditions; and
means for measuring the conductance of the conductor material under superconducting conditions.

57. The apparatus according to claim 56, wherein the subject material is a semiconductor material.

58. The apparatus according to claim 57, wherein the semiconductor material comprises an intrinsic semiconductor.

59. The apparatus according to claim 57, wherein the semiconductor material comprises an extrinsic semiconductor.

60. The apparatus according to claim 59, wherein the semiconductor material is selected from the group comprising an ntype and a ptype semiconductor.

61. The apparatus according to claim 56, wherein the subject material is selected from the group comprising a zinc selenide semiconductor, a gallium arsenide semiconductor and an aluminium gallium arsenide semiconductor.

62. The apparatus according to claim 61, wherein the alumunium gallium arsenide is $Al_{0.4}Ga_{0.6}As$.

63. The apparatus according to claim 56, wherein the subject material comprises a plurality of layers of different materials.

64. The apparatus according to claim 63, wherein the subject material comprises three layers, each layer comprising a different semiconductor material.

65. The apparatus according to claim 63, wherein the conductor material is in contact with a layer of a ntype semiconductor.

66. The apparatus according to claim 56, wherein the conductor material is a Type 1 superconductor.

67. The apparatus according to claim 56, wherein the conductor material is a Type 2 superconductor.

68. The apparatus according to claim 67, wherein the conductor material is selected from the group comprising niobium, vanadium and technetium.

69. The apparatus according to claim 56, wherein the means for measuring the conductance is selected from the group comprising a 4-point probe, a constant current source/meter, or a combination thereof.

* * * * *